United States Patent
Mokhtari

(10) Patent No.: US 7,831,007 B1
(45) Date of Patent: Nov. 9, 2010

(54) CIRCUITRY AND ALGORITHM FOR IMPROVEMENT OF ACQUISITION TIME IN PHASE-LOCKED LOOPS

(75) Inventor: Mehran Mokhtari, Thousand Oaks, CA (US)

(73) Assignee: HRL Laboratories, LLC, Malibu, CA (US)

(*) Notice: Subject to any disclaimer, the term of this patent is extended or adjusted under 35 U.S.C. 154(b) by 637 days.

(21) Appl. No.: 11/973,029

(22) Filed: Oct. 4, 2007

(51) Int. Cl.
*H03D 3/24* (2006.01)

(52) U.S. Cl. .................. 375/376; 375/326; 375/320; 375/356; 331/16; 331/17; 331/25

(58) Field of Classification Search .......... 375/376, 375/326, 320, 356; 331/17, 25, 16
See application file for complete search history.

(56) References Cited

U.S. PATENT DOCUMENTS

| 5,566,204 A | 10/1996 | Kardontchik et al. |
| 5,917,351 A | 6/1999 | Shiue et al. |
| 6,696,526 B1 | 2/2004 | Kaulbach et al. |
| 7,746,185 B2 * | 6/2010 | Staszewski et al. ..... 331/177 V |
| 2005/0105662 A1 * | 5/2005 | Margules .............. 375/376 |
| 2008/0116983 A1 * | 5/2008 | Kinugasa et al. ........ 331/25 |
| 2009/0033429 A1 * | 2/2009 | Song .................... 331/17 |

FOREIGN PATENT DOCUMENTS

WO WO 2004/075414 9/2004

* cited by examiner

*Primary Examiner*—Eva Y Puente
(74) *Attorney, Agent, or Firm*—Tope-McKay & Assoc.

(57) ABSTRACT

Described is circuitry for improving the acquisition/locking time of phase-locked loops (PLL). The circuitry includes a node for tapping voltage from a PLL, with an analog-to-digital converter (ADC) to convert the voltage to a digital signal. A memory module stores the digital signal. A digital-to-analog converter (DAC) converts the digital signal to an analog output. A comparator/threshold detector is included to compare the voltage from the node to the analog signal from the DAC. Based on the comparison, the comparator/threshold detector provides a signal to the memory module to cause the memory module to update its stored digital signal. Upon power-up, the saved voltage is forced into the PLL to force the PLL nodes to the saved values as an initial condition, thereby decreasing acquisition time in the phased locked loop.

36 Claims, 2 Drawing Sheets

CIRCUITRY AND ALGORITHM FOR IMPROVEMENT OF ACQUISITION TIME IN PHASE-LOCKED LOOPS

BACKGROUND OF INVENTION (1) Field of Invention

The present invention relates to phase/frequency acquisition systems, and more particularly, to circuitry for improving the acquisition/locking time of phase-locked loops.

(2) Description of Related Art

When a system sends and receives a signal, the system needs to create a local timing reference for the signal to align with. In most applications, a phase-locked loop (PLL) is used to maintain a generated signal in a fixed relationship to a reference signal. PLLs, at power up or initialization, consume a certain amount of time to acquire the "unknown" input signal's phase and frequency. Depending on the characteristics of the system in which the PLL is being used, the acquisition/locking time may range from tenths of a millisecond to seconds. As can be appreciated, decreasing the acquisition/locking time would provide a benefit to many applications.

While some mechanisms have been devised that decrease the acquisition/locking time, the current approaches compromise between band-width/phase noise and acquisition/locking time. The solutions currently available become ineffective when high-Q PLLs are utilized. Furthermore, most systems are designed to take into account the acquisition/locking time of the utilized PLL. However, an increasing number of applications begin to suffer in performance due to set-up times of the PLLs. For example, all transceivers in RADAR and communication systems, which subject the PLLs to power-down or take them out of the transceiver loop during operation, could benefit from a decreased acquisition/locking time.

Direct Digital Synthesis (DDS) has been offered as a technique for improving the acquisition/locking time of a system. However, the constraints on technologies and circuits needed to utilize DDS for high-Q high-frequency carriers are very high. The previous approaches to speed up the PLL acquisition/locking time are within the phase-locked loop itself and are strongly architecture/frequency dependent (and degrade the performance with respect to resulting phase noise).

To date, little has been done in terms of added/improved algorithms to speed-up the acquisition/locking time. Thus, a continuing need exists for circuitry and algorithms that speed-up the acquisition/locking time for phase-locked loops.

SUMMARY OF INVENTION

The present invention relates to a circuitry for improving the acquisition/locking time of phase-locked loops. The circuitry includes a first switch for connecting with a node in a phase-locked loop. The node is used to tap voltage from the phase-locked loop. The first switch is configured to close when the phase-locked loop is in operation and to open when the phase-locked loop is powered down. An analog-to-digital converter (ADC) is connected with the first switch for converting the voltage to a digital signal, the digital signal being a digital representation of the voltage. A memory module is connected with the ADC to store the digital signal as a saved value. A digital-to-analog converter (DAC) is connected with the memory module to convert the digital signal to an analog output. A second switch is connected with and between the DAC and the node. The second switch is configured to close for a period of time when the phase-locked loop is being powered-up and thereafter open, such that when it is closed, the analog output is input through the node and into the phase-locked loop. A comparator/threshold detector is connected with and between the first switch, the second switch, and the memory module. The comparator/threshold detector is configured to compare the voltage from the first switch to the analog output from the DAC. Based on the comparison, the comparator/threshold detector provides a signal to the memory module to cause the memory module to update its stored digital signal, such that the circuitry can update its digital representation of the voltage in the phase-locked loop. When the phase-locked loop is powered-down, the digital representation of the voltage is stored in the memory module. When the phase-locked loop is powering-up, the digital representation is converted into an analog signal that is output into the phase-locked loop to force the node in the phase-locked loop to the saved values as an initial condition during power-up procedures, thereby decreasing acquisition time in the phased locked loop.

In another aspect, the present invention further comprises a node for insertion within a phase-locked loop for tapping voltage from the phase-locked loop, the node being connected with the first switch.

In yet another aspect, the present invention further comprises an amplifier/driver connected with and between the DAC, the second switch, and the comparator/threshold detector. The amplifier/driver is configured to amplify and drive the analog output that is sent to the node and the comparator/threshold detector.

The present invention further comprises an AC block connected with and between the node, the ADC, and the comparator/threshold detector.

Additionally, the memory module further includes a buffer and a permanent storage media (PSM). When a power-up phase is initiated, the digital representation of the voltage is copied to the buffer which is then sent to the DAC which converts the digital signal to an analog output, with the converted analog output being sent to the second switch to force it to a closed position.

In yet another aspect, the buffer is a storage media that is active when the phase-locked loop is powered to store the digital representation of the voltage. When a power down-phase is initiated, the buffer is copied to the PSM.

In another aspect, the comparator/threshold detector is configured to compare the voltage from the first switch to the analog output from the DAC, so that the comparator/threshold detector generates a signal in response to an absolute difference between the analog output and the voltage. Over a predetermined time interval, if the absolute difference exceeds a pre-determined threshold, the comparator/threshold detector outputs a signal to the memory module to update its stored digital signal by storing a new digital signal to the buffer in the memory module.

In yet another aspect, the memory module further includes a secondary buffer. Additionally, the comparator/threshold detector is further configured to evaluate the voltage from the first switch with the analog output from the DAC, such that if the absolute difference does not exceed a pre-determined threshold, the comparator/threshold detector outputs a signal to the memory module to transfer the digital signal from the buffer to the secondary buffer in the memory module Furthermore, the phase-locked loop has an acquisition time and the comparator/threshold detector is configured to generate a signal in response to an absolute difference between the analog output and the voltage over a predetermined time interval. The time interval is a fraction of the acquisition time of the phase-locked loop.

The present invention further comprises a lock indicator connected with and between the comparator/threshold detector and the memory module. The lock indicator is configured to provide an output that indicates that the PLL is in lock.

In another aspect, the comparator/threshold detector is configured to compare the voltage from the first switch to the analog output from the DAC, such that the comparator/threshold detector generates an increase/decrease signal to the memory module based on the comparison. The increase signal is generated when the analog output is less than the voltage and the decrease signal is provided when the analog output is greater than the voltage. The memory module further includes a digital signal processor (DSP) such that it incrementally increases/decreases its digital representation of the voltage based on the increase/decrease signal from the comparator/threshold detector until a transition is detected in the output of the comparator/threshold detector.

Finally, as can be appreciated by one skilled in the art, the present invention also comprises a method for forming using and forming the circuitry. The method comprises acts of connecting and configuring the relevant parts of the circuitry described herein.

BRIEF DESCRIPTION OF THE DRAWINGS

The objects, features, and advantages of the present invention will be apparent from the following detailed descriptions of the various aspects of the invention in conjunction with reference to the following drawings, where.

DETAILED DESCRIPTION

Figure 1:
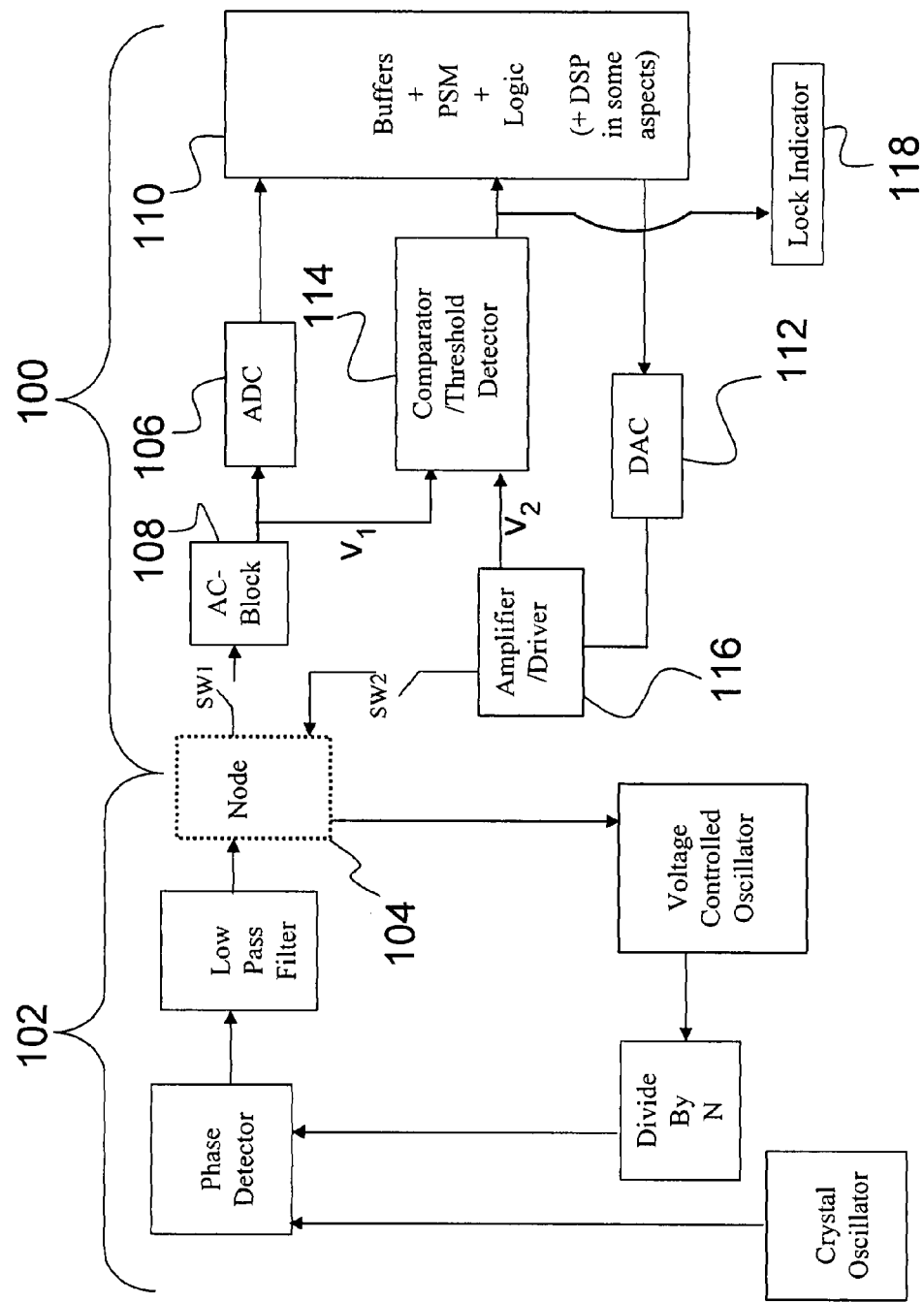
FIG. 1 is a block diagram of circuitry for improvement of acquisition time in phase-locked loops according to the present invention.

The present invention relates to phase/frequency acquisition systems, and more particularly, to circuitry for improving the acquisition/locking time of phase-locked loops. The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Before describing the invention in detail, first a description of various principal aspects of the present invention is provided. Next, an introduction is provided to provide the reader with a general understanding of the present invention. Finally, a description of various aspects of the present invention is provided to give an understanding of the specific details.

(1) Principal Aspects

The present invention has two "principal" aspects. The first is a system for improvement of acquisition time in phase-locked loops. The system is typically in the form of a computer system operating circuitry and/or an algorithm, or alternatively is the circuitry itself. This system may be incorporated into a wide variety of devices that provide different functionalities. The second principal aspect is a method for operating the system. These aspects will be described in more detail below.

(2) Introduction

The present invention is a circuit and algorithm that improves the acquisition/locking time of phase/frequency acquisition systems. The most common approach used for phase/frequency acquisition is utilization of Phase-Locked Loops (PLL). The present invention utilizes storage of critical nodal information in the PLL during operation, and redeploys the stored values at power-up/re-initialization. The circuitry stores the voltage at one or more critical nodes in the PLL during the nominal operation (while in lock), saves the values when power-down procedures are initiated, and forces the nodes to the saved values as an initial condition during the power-up procedures. The extraction and reinforcement of the nodal information is based on a recurrent architecture that introduces robustness and removes the necessity for high-accuracy, electronic circuit solutions. Through use of the circuitry, acquisition time in the PLL is improved due to the saved voltage value that is introduced during the power-up procedure.

(3) Description of Various Aspects

FIG. 1 is a block diagram of circuitry 100 for the improvement of acquisition time in Phase-Locked Loops (PLL) 102. As shown in FIG. 1, a node 104 is inserted within the PLL 102 for tapping (sampling) voltage from the PLL 102. During nominal (powered-up) operation, the value of the node 104 is tapped to an analog-to-digital converter (ADC) 106 through an AC block 108. A non-limiting example of an AC block is an inductor. The ADC 106 is any suitable analog-to-digital converter, non-limiting examples of which include an ultra low power low-pass 1-bit $\Sigma\Delta$-modulator and other low-power direct current-ADC architectures. The digital value corresponding to the node 104-voltage is then fed to a buffer in a memory module 110 and further provided to a digital-to-analog converter (DAC) 112.

The DAC 112 converts the digital signal to an analog output, such as voltage ($V_2$). The DAC's 112 output may be enhanced with an adjustable off-set. The analog output ($V_2$) of the DAC 112 is then compared to the actual node voltage ($V_1$) by a comparator/threshold detector 114.

The output of the comparator/threshold detector 114 is generated based on the absolute difference between the Amplifier/Driver 116 output and the DC value of the node 104 voltage. Over a predetermined time interval, if that absolute difference ever exceeds a pre-determined threshold, the comparator/threshold detector 114 will output a signal to store a new digital value of the node voltage to the buffer in the memory module 110. Otherwise, it will output a signal to transfer the data from the buffer to a secondary buffer in the memory module 110. The buffers are temporary storage media devices.

The predetermined time interval is any suitable time interval monitoring the difference between the Amplifier/Driver 116 output and the DC value of the node 104 voltage. As anon-limiting example, the time interval is a fraction of the normal acquisition time of the PLL 102. A non-limiting example of the predetermined threshold is defined by the best achievable accuracy as a function of the available device parameter uniformities and ADC/DAC resolutions.

Due to the comparative nature of the read-out, the actual linearity and accuracy of the ADC 106 and DAC 112 are not critical, as long as the comparator/threshold detector's 114 output is near zero.

When a power-down phase is initiated, the buffer is copied to a Permanent Storage Media (PSM) in the memory module 110 and a first switch (SW1) is opened. A non-limiting example of the PSM is an Electrically Erasable, Programmable Read-Only Memory (EEPROM) that stores the last value provided to it.

When the power-up phase commences in the PLL 102, the value stored in the PSM is dumped to the buffer which is then fed to the DAC 112. The DAC 112 converts the value to an analog output which is sent to the Amplifier/Driver 116. The Amplifier/Driver 116, together with a second switch (SW2), serves a "High-Z/Force" function. When SW2 is closed for a predetermined period of time, the last saved voltage is fed into the PLL 102 to force the node 104 to the saved values as an initial condition during the power-up procedures. After the predetermined period of time, the Amplifier/Driver 116 returns to a "High-Z" mode (SW2 opened) and the system starts reading the new values (with SW1 closed) in preparation for the next power-down. A non-limiting example of the predetermined period of "Force" time is a fraction of the normal acquisition time of the PLL 102. The Amplifier/Driver incorporates the function of possibly "adjustable off-set" and, together with SW2, is the "High-Z/Force" block.

Additionally, a lock indicator 118 can be included such that the output from the comparator serves as an indicator that the PLL 102 is in lock (the same condition as that to transfer data from a buffer to a secondary buffer). This is a unique function of this circuitry, as traditional circuitry requires added circuitry in order to implement this function.

Figure 2:
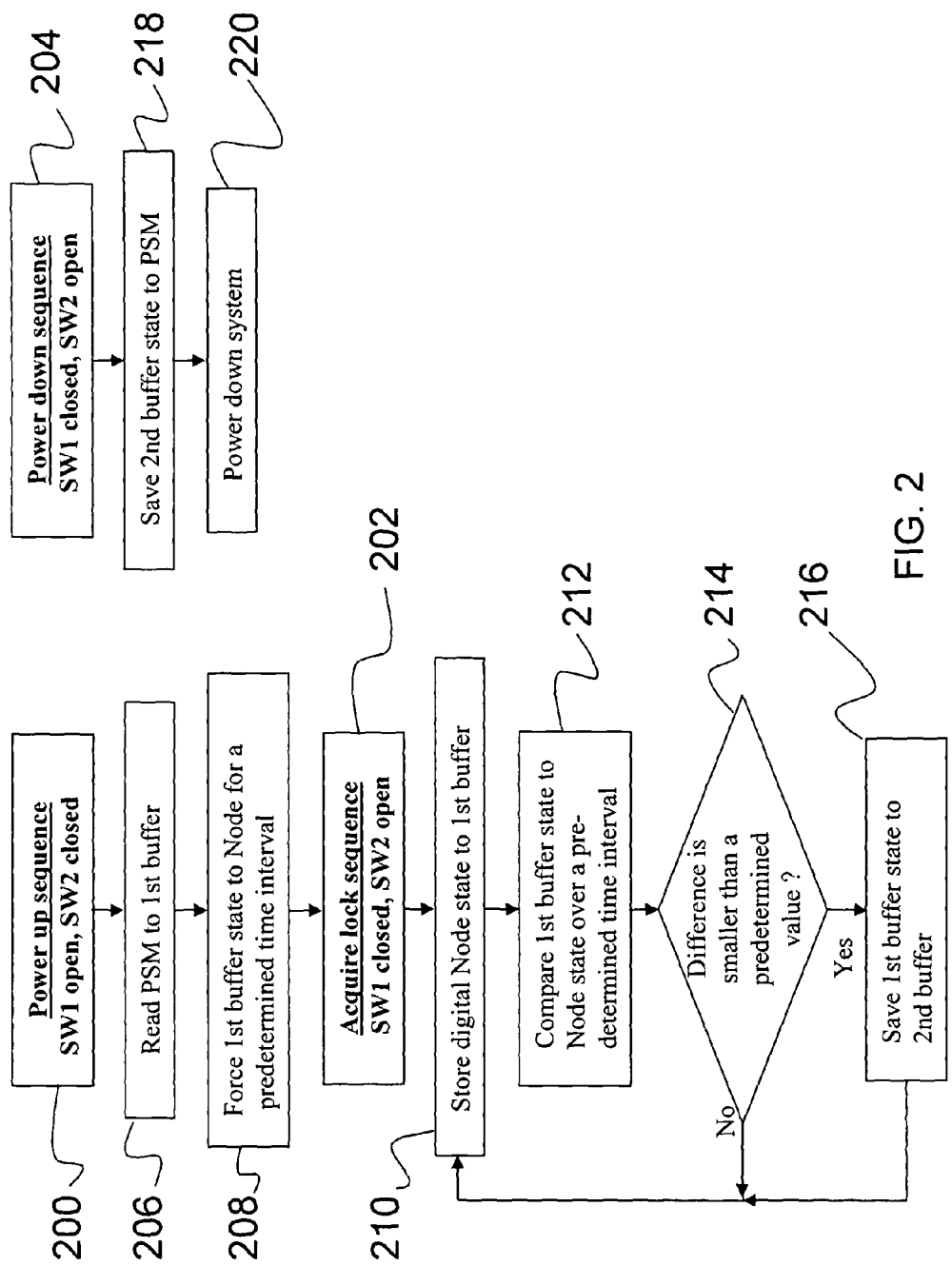
FIG. 2 is a flow chart depicting the algorithm for phase-locked loop locking speed-up, using the circuitry shown in FIG. 1.

For further illustration, FIG. 2 is a flow chart depicting the algorithm for PLL locking speed-up, using the circuitry described herein. FIG. 2 illustrates the algorithm for the power up sequence 200, the acquire lock sequence 202, and the power down sequence 204.

During the power-up sequence 200, the value stored on the PSM is read to the first buffer 206. The first buffer state is then forced to the node for a predetermined time interval 208. After the lock sequence is acquired, SW1 is closed and SW2 is opened 202. The digital node state is then stored to the first buffer 210. The first buffer state is then compared to the Node state over a predetermined time interval 212. The comparison is done to determine if the difference is smaller than a predetermined value 214. If the difference is not smaller than the predetermined value, then a signal is sent to store the digital node state to the first buffer 210. Alternatively, if the difference is smaller than the predetermined value, then the first buffer state is saved to a second buffer 216.

During the power-down sequence 204, the second buffer state is saved to the PSM 218. Thereafter, the system is powered down 220.

The algorithm may be superposed to any number of nodes using a tree of switches and having an array of digital nodal information in the PSM.

In another aspect, the output of the comparator/threshold detector 114 may indicate a "+" or "−" as the result of the comparison. In this aspect, if the DAC 112 output is higher/lower than the actual node 104-voltage, then a digital signal processor (DSP) in the memory module 110 increments/decrements the digital representation of the node 104 voltage until a transition is detected in the output of the comparator/threshold detector 114. When the difference is acceptable, the data is stored in a secondary buffer. A non-limiting example of an acceptable difference is defined by the best achievable accuracy as a function of the available device parameter uniformities and ADC/DAC resolutions.

What is claimed is:

1. A circuitry for improving the acquisition/locking time of phase-locked loops, comprising:
   a first switch for connecting with a node in a phase-locked loop where the node taps voltage from the phase-locked loop, the first switch configured to close when the phase-locked loop is in operation and to open when the phase-locked loop is powered down;
   an analog-to-digital converter (ADC) connected with the first switch for converting the voltage to a digital signal, the digital signal being a digital representation of the voltage;
   a memory module connected with the ADC to store the digital signal as a saved value;
   a digital-to-analog converter (DAC) connected with the memory module to convert the digital signal to an analog output;
   a second switch connected with and between the DAC and the node, the second switch configured to close for a period of time when the phase-locked loop is being powered-up and thereafter open, such that when the second switch is closed, the analog output is input through the node and into the phase-locked loop; and
   a comparator/threshold detector connected with and between the first switch, the second switch, and the memory module, the comparator/threshold detector being configured to compare the voltage from the first switch to the analog output from the DAC, and based on the comparison, to provide a signal to the memory module to cause the memory module to update its stored digital signal, such that the circuitry can update its digital representation of the voltage in the phase-locked loop such that when the phase-locked loop is powered-down, the digital representation of the voltage is stored in the memory module, and when the phase-locked loop is powering-up, the digital representation is converted into an analog signal that is output into the phase-locked loop to force the node in the phase-locked loop to the saved values as an initial condition during power-up procedures, thereby decreasing acquisition time in the phased locked loop.

2. A circuitry for improving the acquisition/locking time of phase-locked loops as set forth in claim 1, further comprising the node for insertion within the phase-locked loop and for tapping voltage from the phase-locked loop, the node being connected with the first switch.

3. A circuitry for improving the acquisition/locking time of phase-locked loops as set forth in claim 2, further comprising an amplifier/driver connected with and between the DAC, the second switch, and the comparator/threshold detector, the amplifier/driver being configured to amplify and drive the analog output that is sent to the node and the comparator/threshold detector.

4. A circuitry for improving the acquisition/locking time of phase-locked loops as set forth in claim 3, further comprising an AC block connected with and between the node, the ADC, and the comparator/threshold detector.

5. A circuitry for improving the acquisition/locking time of phase-locked loops as set forth in claim 4, wherein the memory module further includes a buffer and a permanent storage media (PSM), and wherein when a power-up phase is initiated, the digital representation of the voltage is copied to the buffer which is then sent to the DAC which converts the digital signal to an analog output, with the converted analog output being sent to the second switch to force the second switch to a closed position.

6. A circuitry for improving the acquisition/locking time of phase-locked loops as set forth in claim 5, wherein the buffer is a storage media that is active when the phase-locked loop is powered to store the digital representation of the voltage, and wherein when a power down-phase is initiated, the buffer is copied to the PSM.

7. A circuitry for improving the acquisition/locking time of phase-locked loops as set forth in claim 6, wherein the comparator/threshold detector is configured to compare the voltage from the first switch to the analog output from the DAC, so that the comparator/threshold detector generates a signal in response to an absolute difference between the analog output and the voltage, wherein over a predetermined time interval, if the absolute difference exceeds a pre-determined threshold, the comparator/threshold detector outputs a signal to the memory module to update its stored digital signal by storing a new digital signal to the buffer in the memory module.

8. A circuitry for improving the acquisition/locking time of phase-locked loops as set forth in claim 7, wherein the memory module further includes a secondary buffer, and wherein the comparator/threshold detector is further configured to evaluate the voltage from the first switch with the analog output from the DAC, such that if the absolute difference does not exceed a pre-determined threshold, the comparator/threshold detector outputs a signal to the memory module to transfer the digital signal from the buffer to the secondary buffer in the memory module.

9. A circuitry for improving the acquisition/locking time of phase-locked loops as set forth in claim 8, wherein the phase-locked loop has an acquisition time and the comparator/threshold detector is configured to generate a signal in response to an absolute difference between the analog output and the voltage over a predetermined time interval, where the time interval is a fraction of the acquisition time of the phase-locked loop.

10. A circuitry for improving the acquisition/locking time of phase-locked loops as set forth in claim 9, further comprising a lock indicator connected with and between the comparator/threshold detector and the memory module, the lock indicator being configured to provide an output that indicates that the PLL is in lock.

11. A circuitry for improving the acquisition/locking time of phase-locked loops as set forth in claim 6, wherein the comparator/threshold detector is configured to compare the voltage from the first switch to the analog output from the DAC, such that the comparator/threshold detector generates an increase/decrease signal to the memory module based on the comparison, where the increase signal is generated when the analog output is less than the voltage and the decrease signal is provided when the analog output is greater than the voltage, and wherein the memory module further includes a digital signal processor (DSP) such that it incrementally increases/decreases its digital representation of the voltage based on the increase/decrease signal from the comparator/threshold detector until a transition is detected in the output of the comparator/threshold detector.

12. A circuitry for improving the acquisition/locking time of phase-locked loops as set forth in claim 2, further comprising an AC block connected with and between the node, the ADC, and the comparator/threshold detector.

13. A circuitry for improving the acquisition/locking time of phase-locked loops as set forth in claim 1, wherein the memory module further includes a buffer and a permanent storage media (PSM), and wherein when a power-up phase is initiated, the digital representation of the voltage is copied to the buffer which is then sent to the DAC which converts the digital signal to an analog output, with the converted analog output being sent to the second switch to force it to a closed position.

14. A circuitry for improving the acquisition/locking time of phase-locked loops as set forth in claim 13, wherein the buffer is a storage media that is active when the phase-locked loop is powered to store the digital representation of the voltage, and wherein when a power down-phase is initiated, the buffer is copied to the PSM.

15. A circuitry for improving the acquisition/locking time of phase-locked loops as set forth in claim 13, wherein the comparator/threshold detector is configured to compare the voltage from the first switch to the analog output from the DAC, so that the comparator/threshold detector generates a signal in response to an absolute difference between the analog output and the voltage, wherein over a predetermined time interval, if the absolute difference exceeds a pre-determined threshold, the comparator/threshold detector outputs a signal to the memory module to update its stored digital signal by storing a new digital signal to the buffer in the memory module.

16. A circuitry for improving the acquisition/locking time of phase-locked loops as set forth in claim 13, wherein the memory module further includes a secondary buffer, and wherein the comparator/threshold detector is further configured to evaluate the voltage from the first switch with the analog output from the DAC, such that if the absolute difference does not exceed a pre-determined threshold, the comparator/threshold detector outputs a signal to the memory module to transfer the digital signal from the buffer to the secondary buffer in the memory module.

17. A circuitry for improving the acquisition/locking time of phase-locked loops as set forth in claim 1, wherein the phase-locked loop has an acquisition time and the comparator/threshold detector is configured to generate a signal in response to an absolute difference between the analog output and the voltage over a predetermined time interval, where the time interval is a fraction of the acquisition time of the phase-locked loop.

18. A circuitry for improving the acquisition/locking time of phase-locked loops as set forth in claim 1, further comprising a lock indicator connected with and between the comparator/threshold detector and the memory module, the lock indicator being configured to provide an output that indicates that the PLL is in lock.

19. A circuitry for improving the acquisition/locking time of phase-locked loops as set forth in claim 1, wherein the comparator/threshold detector is configured to compare the voltage from the first switch to the analog output from the DAC, such that the comparator/threshold detector generates an increase/decrease signal to the memory module based on the comparison, where the increase signal is generated when the analog output is less than the voltage and the decrease signal is provided when the analog output is greater than the voltage, and wherein the memory module further includes a digital signal processor (DSP) such that it incrementally increases/decreases its digital representation of the voltage based on the increase/decrease signal from the comparator/threshold detector until a transition is detected in the output of the comparator/threshold detector.

20. A method for improving the acquisition/locking time of phase-locked loops, comprising acts of:
connecting a first switch with a node in a phase-locked loop where the node is used for tapping voltage from the phase-locked loop, the first switch being configured to close when the phase-locked loop is in operation and to open when the phase-locked loop is powered down;
connecting an analog-to-digital (ADC) with the first switch to convert the voltage to a digital signal, the digital signal being a digital representation of the voltage;
connecting a memory module with the ADC to store the digital signal as a saved value;
connecting a digital-to-analog converter (DAC) with the memory module to convert the digital signal to an analog output;
connecting a second switch with and between the DAC and the node, the second switch configured to close for a period of time when the phase-locked loop is being powered-up and thereafter open, such that when the second switch is closed, the analog output is input through the node and into the phase-locked loop; and
connecting a comparator/threshold detector with and between the first switch, the second switch, and the memory module, the comparator/threshold detector being configured to compare the voltage from the first switch to the analog output from the DAC, and based on the comparison, to provide a signal to the memory module to cause the memory module to update its stored digital signal, such that the circuitry can update its digital representation of the voltage in the phase-locked loop such that when the phase-locked loop is powered-down, the digital representation of the voltage is stored in the memory module, and when the phase-locked loop is powering-up, the digital representation is converted into an analog signal that is output into the phase-locked loop to force the node in the phase-locked loop to the saved values as an initial condition during power-up procedures, thereby decreasing acquisition time in the phased locked loop.

21. A method for improving the acquisition/locking time of phase-locked loops as set forth in claim 20, further comprising an act of connecting an amplifier/driver with and between the DAC, the second switch, and the comparator/threshold detector, the amplifier/driver being configured to amplify and drive the analog output that is sent to the node and the comparator/threshold detector.

22. A method for improving the acquisition/locking time of phase-locked loops as set forth in claim 21, further comprising an act of connecting an AC block with and between the node, the ADC, and the comparator/threshold detector.

23. A method for improving the acquisition/locking time of phase-locked loops as set forth in claim 22, further comprising an act of selecting the memory module such that the memory module further includes a buffer and a permanent storage media (PSM), and wherein when a power-up phase is initiated, the digital representation of the voltage is copied to the buffer which is then sent to the DAC which converts the digital signal to an analog output, with the converted analog output being sent to the second switch to force it to a closed position.

24. A method for improving the acquisition/locking time of phase-locked loops as set forth in claim 23, further comprising an act of selecting the buffer such that the buffer is a storage media that is active when the phase-locked loop is powered to store the digital representation of the voltage, and wherein when a power down-phase is initiated, the buffer is copied to the PSM.

25. A method for improving the acquisition/locking time of phase-locked loops as set forth in claim 24, further comprising an act of configuring the comparator/threshold detector to compare the voltage from the first switch to the analog output from the DAC, so that the comparator/threshold detector generates a signal in response to an absolute difference between the analog output and the voltage, wherein over a predetermined time interval, if the absolute difference exceeds a predetermined threshold, the comparator/threshold detector outputs a signal to the memory module to update its stored digital signal by storing a new digital signal to the buffer in the memory module.

26. A method for improving the acquisition/locking time of phase-locked loops as set forth in claim 25, further comprising acts of including a secondary buffer within the memory module and configuring the comparator/threshold detector to evaluate the voltage from the first switch with the analog output from the DAC, such that if the absolute difference does not exceed a pre-determined threshold, the comparator/threshold detector outputs a signal to the memory module to transfer the digital signal from the buffer to the secondary buffer in the memory module.

27. A method for improving the acquisition/locking time of phase-locked loops as set forth in claim 26, further comprising an act of configuring the comparator/threshold detector to generate a signal in response to an absolute difference between the analog output and the voltage over a predetermined time interval, where the time interval is a fraction of an acquisition time of the phase-locked loop.

28. A method for improving the acquisition/locking time of phase-locked loops as set forth in claim 27, further comprising an act of connecting a lock indicator with and between the comparator/threshold detector and the memory module, the lock indicator being configured to provide an output that indicates that the PLL is in lock.

29. A method for improving the acquisition/locking time of phase-locked loops as set forth in claim 24, further comprising an act of configuring the comparator/threshold detector to compare the voltage from the first switch to the analog output from the DAC, such that the comparator/threshold detector generates an increase/decrease signal to the memory module based on the comparison, where the increase signal is generated when the analog output is less than the voltage and the decrease signal is provided when the analog output is greater than the voltage, and wherein the memory module further includes a digital signal processor (DSP) such that it incrementally increases/decreases its digital representation of the voltage based on the increase/decrease signal from the comparator/threshold detector until a transition is detected in the output of the comparator/threshold detector.

30. A method for improving the acquisition/locking time of phase-locked loops as set forth in claim 20, further comprising acts of:
connecting an AC block with and between the node, the ADC, and the comparator/threshold detector; and selecting the memory module such that the memory module further includes a buffer and a permanent storage media (PSM), and wherein when a power-up phase is initiated, the digital representation of the voltage is copied to the buffer which is then sent to the DAC which converts the digital signal to an analog output, with the converted analog output being sent to the second switch to force the second switch to a closed position.

31. A method for improving the acquisition/locking time of phase-locked loops as set forth in claim 30, further comprising an act of selecting the buffer such that the buffer is a storage media that is active when the phase-locked loop is powered to store the digital representation of the voltage, and wherein when a power down-phase is initiated, the buffer is copied to the PSM.

32. A method for improving the acquisition/locking time of phase-locked loops as set forth in claim 30, further comprising an act of configuring the comparator/threshold detector to compare the voltage from the first switch to the analog output from the DAC, so that the comparator/threshold detector generates a signal in response to an absolute difference between the analog output and the voltage, wherein over a predetermined time interval, if the absolute difference exceeds a pre-determined threshold, the comparator/threshold detector outputs a signal to the memory module to update its stored digital signal by storing a new digital signal to the buffer in the memory module.

33. A method for improving the acquisition/locking time of phase-locked loops as set forth in claim 30, further comprising acts of including a secondary buffer within the memory module and configuring the comparator/threshold detector to evaluate the voltage from the first switch with the analog output from the DAC, such that if the absolute difference does not exceed a pre-determined threshold, the comparator/threshold detector outputs a signal to the memory module to transfer the digital signal from the buffer to the secondary buffer in the memory module.

34. A method for improving the acquisition/locking time of phase-locked loops as set forth in claim 20, further comprising an act of configuring the comparator/threshold detector to generate a signal in response to an absolute difference between the analog output and the voltage over a predetermined time interval, where the time interval is a fraction of an acquisition time of the phase-locked loop.

35. A method for improving the acquisition/locking time of phase-locked loops as set forth in claim 20, further comprising an act of connecting a lock indicator with and between the comparator/threshold detector and the memory module, the lock indicator being configured to provide an output that indicates that the PLL is in lock.

36. A method for improving the acquisition/locking time of phase-locked loops as set forth in claim 20, further comprising an act of configuring the comparator/threshold detector to compare the voltage from the first switch to the analog output from the DAC, such that the comparator/threshold detector generates an increase/decrease signal to the memory module based on the comparison, where the increase signal is generated when the analog output is less than the voltage and the decrease signal is provided when the analog output is greater than the voltage, and wherein the memory module further includes a digital signal processor (DSP) such that it incrementally increases/decreases its digital representation of the voltage based on the increase/decrease signal from the comparator/threshold detector until a transition is detected in the output of the comparator/threshold detector.

\* \* \* \* \*